United States Patent [19]

Aoki et al.

[11] Patent Number: 5,025,168

[45] Date of Patent: Jun. 18, 1991

[54] ALIGNMENT APPARATUS INCLUDING THREE BEAMS AND THREE GRATINGS

[75] Inventors: Shinichiro Aoki; Takeo Sato, both of Kawasaki; Katsumasa Yamaguchi, Sagamihara; Masaki Yamamoto, Tokyo, all of Japan

[73] Assignee: Matsushita Electric Industrial Co., Ltd., Osaka, Japan

[21] Appl. No.: 518,420

[22] Filed: May 3, 1990

[30] Foreign Application Priority Data

May 12, 1989 [JP] Japan ..................... 1-118986

[51] Int. Cl.$^5$ .................... G01N 21/86; G01V 9/04
[52] U.S. Cl. ......................... 250/548; 356/401
[58] Field of Search ............ 250/548, 458.1; 356/401, 400

[56] References Cited

U.S. PATENT DOCUMENTS

| | | | |
|---|---|---|---|
| 3,971,951 | 7/1976 | Rikukawa et al. | 250/458.1 |
| 4,311,389 | 1/1982 | Fay et al. | 356/400 |
| 4,677,301 | 6/1987 | Tanimoto et al. | 250/548 |
| 4,708,484 | 11/1987 | Komeyama et al. | 250/401 |

OTHER PUBLICATIONS

"Application of Zone Plates to Alignment in Microlithography", by M. Feldman and et al., 1981 American Vacuum Society, pp. 1224–1228.

*Primary Examiner*—David C. Nelms
*Assistant Examiner*—T. Davenport
*Attorney, Agent, or Firm*—Pollock, VandeSande & Priddy

[57] ABSTRACT

A light source emits light having two components which ave slightly-different frequencies and which have different planes of polarization. The emitted light is separated into first, second, and third parts travelling along different paths respectively. First, second, and third reference gratings diffract the first, second, and third light parts respectively. First, second, and third illumination optical systems selectively transmit the diffracted first, second, and third light parts respectively. First, second, and third mark gratings having predetermined orientations are formed on a mask and are illuminated with the first, second, and third light parts coming from the first, second, and third illumination systems respectively. Similarly, first, second, and third mark gratings are formed on a wafer and are illuminated with the first, second, and third light parts coming from the first, second, and third illumination systems respectively. A first device detects first optical beat signals of the diffracted lights coming from the first mark grating on the mask and the first mark grating on the wafer. Similar detection is made for the diffracted lights coming from the other mark gratings on the mask and the wafer.

10 Claims, 2 Drawing Sheets

ALIGNMENT APPARATUS INCLUDING THREE BEAMS AND THREE GRATINGS

BACKGROUND OF THE INVENTION

This invention relates to an alignment apparatus such as a mask-to-wafer alignment system for photolithography in fabricating semiconductor devices.

SPIE Vol. 773, Electron-Beam, X-Ray and Ion-Beam Lithographies VI (1987), pages 7-14, discloses a new interferometric optical-heterodyne method which has been developed for detection of displacement between a mask and a wafer. This prior-art method uses three symmetrically-arranged gratings and a coherent light consisting of two orthogonally-polarized components with different frequencies. The displacement between the mask and the wafer is detected from the phases of beat signals. According to the prior-art method, using a 0.76-micrometer-period-grating system and a He-Ne transverse-mode Zeeman laser (wave length=0.6328 micrometers), sensitivity better than 1°/0.01 micrometers was obtained and displacement smaller than 5 nm was detected independently of the mask-wafer gap variations.

SUMMARY OF THE INVENTION

It is an object of this invention to provide an excellent alignment apparatus.

According to a first aspect of this invention, an apparatus for aligning a mask and a wafer comprises a light source emitting light having two components which have slightly-different frequencies and which have different planes of polarization; means for separating the light emitted from the light source into first, second, and third light parts travelling along different paths respectively; first, second, and third reference gratings diffracting the first, second, and third light parts respectively; first, second, and third illumination optical systems selectively transmitting the diffracted first, second, and third light parts coming from the first, second, and third gratings respectively; first, second, and third mark gratings formed on the mask and illuminated with the first, second, and third light parts coming from the first, second, and third illumination systems respectively, wherein the first, second, and third mark gratings on the mask diffract the first, second, and third light parts coming from the first, second, and third illumination systems respectively, wherein the first and second mark gratings on the mask are directed in parallel, and wherein the third mark grating on the mask is directed perpendicular to the first and second mark gratings on the mask; first, second, and third mark gratings formed on the wafer in correspondence with the first, second, and third mark gratings on the mask and illuminated with the first, second, and third light parts coming from the first, second, and third illumination systems respectively, wherein the first, second, and third mark gratings on the wafer diffract the first, second, and third light parts coming from the first, second, and third illumination systems respectively, wherein the first and second mark gratings on the wafer are directed in parallel, and wherein the third mark grating on the wafer is directed perpendicular to the first and second mark gratings on the wafer; a first detecting device detecting first optical beat signals of the diffracted lights coming from the first mark grating on the mask and the first mark grating on the wafer, the first optical beat signals representing a positional error between the mask and the wafer; means for comparing phases of the first detected beat signals and generating a first control signal dependent on a difference between the phases of the first beat signals; a second detecting device detecting second optical beat signals of the diffracted lights coming from the second mark grating on the mask and the second mark grating on the wafer, the second optical beat signals representing a positional error between the mask and the wafer; means for comparing phases of the second detected beat signals and generating a second control signal dependent on a difference between the phases of the second beat signals; a third detecting device detecting third optical beat signals of the diffracted lights coming from the third mark grating on the mask and the third mark grating on the wafer, the third optical beat signals representing a positional error between the mask and the wafer; means for comparing phases of the third detected beat signals and generating a third control signal dependent on a difference between the phases of the third beat signals; and means for adjusting relative positions of the mask and the wafer in accordance with the first, second, and third control signals.

According to a second aspect of this invention, an apparatus for aligning a mask and a wafer comprises a light source emitting light having two components which have slightly-different frequencies and which have different planes of polarization; means for separating the light emitted from the light source into first, second, and third light parts travelling along different paths respectively; first, second, and third reference gratings diffracting the first, second, and third light parts respectively; first, second, and third illumination optical systems selectively transmitting the diffracted first, second, and third light parts coming from the first, second, and third gratings respectively; first, second, and third mark gratings formed on the mask and illuminated with the first, second, and third light parts coming from the first, second, and third illumination systems respectively, wherein the first, second, and third mark gratings on the mask diffract the first, second, and third light parts coming from the first, second, and third illumination systems respectively, wherein the first and second mark gratings on the mask are directed in parallel, and wherein the third mark grating on the mask is directed perpendicular to the first and second mark gratings on the mask; first, second, and third mark gratings formed on the wafer in correspondence with the first, second, and third mark gratings on the mask and illuminated with the first, second, and third light parts coming from the first, second, and third illumination systems respectively, wherein the first, second, and third mark gratings on the wafer diffract the first, second, and third light parts coming from the first, second, and third illumination systems respectively, wherein the first and second mark gratings on the wafer are directed in parallel, and wherein the third mark grating on the wafer is directed perpendicular to the first and second mark gratings on the wafer; a first detecting device detecting first optical beat signals of the diffracted lights coming from the first mark grating on the mask and the first mark grating on the wafer, the first optical beat signals representing a positional error between the mask and the wafer; a second detecting device detecting second optical beat signals of the diffracted lights coming from the second mark grating on the mask and the second mark grating on the wafer, the second optical beat signals representing a positional error between the mask and the wafer; a third detecting device detecting third optical beat signals of the diffracted lights coming from the third mark grating on the mask and the third mark grating on the wafer, the third optical beat signals representing a positional error between the mask and the wafer; and means for adjusting relative positions of the mask and the wafer.

According to a third aspect of this invention, an apparatus for aligning a mask and a wafer comprises a light source emitting light having two components which have slightly-different frequencies and which have different planes of polarization; means for separating the light emitted from the light source into first, second, and third light parts travelling along different paths respectively; first, second, and third reference gratings diffracting the first, second, and third light parts and thereby generating first, second, and third diffracted lights respectively; first, second, and third mark gratings formed on the mask wherein lines of the first mark grating on the mask are parallel to lines of the second mark grating on the mask, and lines of the third mark grating on the mask are perpendicular to the lines of the first and second mark gratings on the mask; first, second, and third mark gratings formed on the wafer in correspondence with the first, second, and third mark gratings on the mask, wherein lines of the first mark grating on the wafer are parallel to lines of the second mark grating on the wafer, and lines of the third mark grating on the wafer are perpendicular to the lines of the first and second mark gratings on the wafer; means for selecting predetermined-order components of the first diffracted light and thereby generating first predetermined-order lights; means for applying the first predetermined-order lights to the first mark grating on the mask and the first mark grating on the wafer; means for detecting beats between the first predetermined-order lights diffracted by the first mark grating on the mask and the first predetermined-order lights diffracted by the first mark grating on the wafer; means for selecting predetermined-order components of the second diffracted light and thereby generating second predetermined-order lights; means for applying the second predetermined-order lights to the second mark grating on the mask and the second mark grating on the wafer; means for detecting beats between the second predetermined-order lights diffracted by the second mark grating on the mask and the second predetermined-order lights diffracted by the second mark grating on the wafer; means for selecting predetermined-order components of the third diffracted light and thereby generating third predetermined-order lights; means for applying the third predetermined-order lights to the third mark grating on the mask and the third mark grating on the wafer; and means for detecting beats between the third predetermined-order lights diffracted by the third mark grating on the mask and the third predetermined-order lights diffracted by the third mark grating on the wafer.

DESCRIPTION OF THE PREFERRED EMBODIMENT

Figure 1:
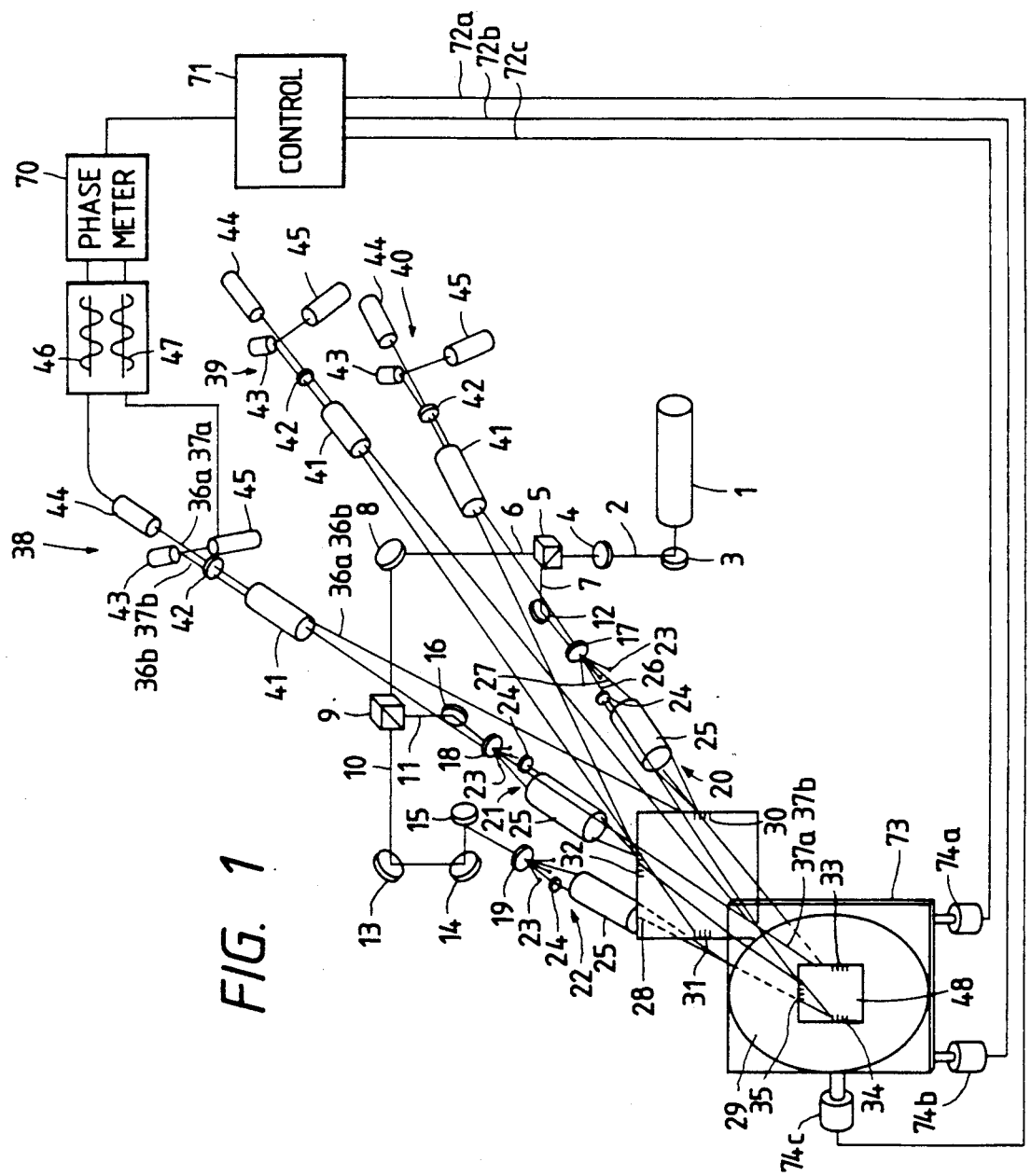
FIG. 1 is a diagrammatic perspective view of an alignment apparatus according to an embodiment of this invention.

With reference to FIG. 1, a Zeeman laser 1 emits light 2 whose major portion has two orthogonally-polarized components with slightly-different frequencies. Another portion of the laser light 2 is elliptically polarized. In view of an elliptically polarized component, the laser light 2 is reflected by a mirror 2 and is then passed through a quarter wave plate 4. The quarter wave plate 4 functions to compensate the phase of the laser light 2. After being passed through the quarter wave plate 4, the laser light 2 is incident to a first beam splitter 5. The laser light 2 is separated by the first beam splitter 5 into two parts 6 and 7 traveling along different paths.

The laser light 7 meets a mirror 12 and is reflected by the mirror 12 toward a first reference diffraction grating 17.

The laser light 6 meets a mirror 8 and is reflected by the mirror 8 toward a second beam splitter 9. The laser light 6 is incident to the second beam splitter 9, being separated by the second beam splitter 9 into two parts 10 and 11 traveling along different paths. The laser light 11 meets a mirror 16 and is reflected by the mirror 16 toward a second reference diffraction grating 18. The laser light 10 is successively reflected by mirrors 13, 14, and 15, being directed toward a third reference diffraction grating 19.

The direction of the path of the laser light 7 between the mirror 12 and the first reference diffraction grating 17, the direction of the path of the laser light 11 between the mirror 16 and the second reference diffraction grating 18, and the direction of the path of the laser light 10 between the mirror 15 and the third reference diffraction grating 19 are chosen to be approximately equal to each other.

The laser lights 7, 11, and 10 reach the first, second, and third reference diffraction gratings 17, 18, and 19, and are diffracted by the devices 17, 18, and 19 respectively. Then, the diffracted lights are passed through illumination optical systems 20, 21, and 22 respectively. The illumination optical systems 20, 21, and 22 have similar designs. Each of the illumination optical systems 20, 21, and 22 includes a spatial filter 23, a half wave plate 24, and a Fourier transform lens 25.

In each of the illumination optical systems 20, 21, and 22, the spatial filter selects ±1-order components 26 and 27 of the diffracted light and removes the 0-order, ±2-order, and higher-order components of the diffracted light. After the half wave plate 24 changes the phase of the −1-order diffracted light 27 by 180 degrees, the −1-order diffracted light 27 is incident to the Fourier transform lens 25. The +1-order diffracted light 26 is directly incident to the Fourier transform lens 25.

First, second, and third diffraction gratings 30, 31, and 32 serving as position alignment marks are formed on edges of a mask 28. The first and second gratings 30 and 31 are located in an opposing relation. The lines of the first grating 30 are parallel to the lines of the second grating 31. The lines of the third grating 32 are perpendicular to the lines of the first and second gratings 30 and 31.

First, second, and third diffraction gratings 33, 34, and 35 serving as position alignment marks are formed on edges of a light exposure region 48 of a wafer 29. The first and second gratings 33 and 34 are located in an opposing relation. The lines of the first grating 33 are parallel to the lines of the second grating 34. The lines of the third grating 35 are perpendicular to the lines of the first and second gratings 33 and 34. The first, second, and third grating 33, 34, and 35 on the wafer 29 are designed in position and structure so as to correspond to the first, second, and third gratings 30, 31, and 32 on the mask 28 respectively.

The Fourier transform lens 25 of the illumination optical system 20 focus the related ±1-order lights 26 and 27 on the first grating 30 of the mask 28 and the first grating 33 on the wafer 29. The ±1-order lights 26 and 27 are diffracted by the first grating 30 of the mask 28 and the first grating 33 of the wafer 29. Parts 36a and 36b of the ±1-order lights diffracted by the first grating 30 of the mask 28, and parts 37a and 37b of the ±1-order lights diffracted by the first grating 33 of the wafer 29 advance along approximately equal directions. The ±1-order lights 36a and 36b and the ±1-order lights 37a and 37b are caught by a first detecting device 38.

The Fourier transform lens 25 of the illumination optical system 22 focus the related ±1-order lights 26 and 27 on the second grating 31 of the mask 28 and the second grating 34 on the wafer 29. The ±1-order lights 26 and 27 are diffracted by the second grating 31 of the mask 28 and the second grating 34 of the wafer 29. Parts 36a and 36b of the ±1-order lights diffracted by the second grating 31 of the mask 28, and parts 37a and 37b of the ±1-order lights diffracted by the second grating 34 of the wafer 29 advance along approximately equal directions. The ±1-order lights 36a and 36b and the ±1-order ligths 37a and 37b are caught by a second detecting device 39.

The Fourier transform lens 25 of the illumination optical system 21 focus the related ±1-order lights 26 and 27 on the third grating 32 of the mask 28 and the third grating 35 on the wafer 29. The ±1-order lights 26 and 27 are diffracted by the third grating 32 of the mask 28 and the third grating 35 of the wafer 29. Parts 36a and 36b of the ±1-order lights diffracted by the third grating 32 of the mask 28, and parts 37a and 37b of the ±1-order lights diffracted by the third grating 35 of the wafer 29 advance along approximately equal directions. The ±1-order lights 36a and 36b and the ±1-order lights 37a and 37b are caught by a third detecting device 40.

Each of the illumination optical systems 20, 21, and 22 is telecentric at a wafer side or an output side. Each of the illumination optical systems 20, 21, and 22 may be telecentric also at an incident side.

The first, second, and third detecting devices 38, 39, and 40 have similar designs. Each of the detecting devices 38, 39, and 40 includes a focusing lens 41, a polarizing filter 42, a knife-edged mirror 43, a pair of photodetectors 44 and 45. For example, the photodetectors 44 and 45 are composed of photomultipliers. The ±1-order lights 36a and 36b and the ±1-order lights 37a and 37b are focused by the focusing lens 41, being incident to the polarizing filter 42. The polarizing filter 42 functions to select components of the lights which have a predetermined direction of polarization. After passing through the polarizing filter 42, the light 36a and the light 37a which have equal phases are incident to the photodetector 44 while the light 36b and the light 37b which have equal phases are reflected by the knife-edged mirror 43 and are then incident to the photodetector 45. The knife-edged mirror 43 functions to separate the lights coming from the polarizing filter 42. The photodetector 44 converts the incident lights 36a and 37a into a corresponding electric beat signal 46 which represents an interference between the lights 36a and 37a. For example, the beat signal 46 has a sinusoidal waveform and a frequency equal to the difference between the frequencies of the two major components of the Zeeman laser light 2. The beat signal 46 may be indicated on a suitable display. The photodetector 45 converts the incident lights 36b and 37b into a corresponding electric beat signal 47 which represents an interference between the lights 36b and 37b. For example, the beat signal 47 has a sinusoidal waveform and a frequency equal to the difference between the frequencies of the two major components of the Zeeman laser light 2. The beat signal 47 may be indicated on the display.

The beat signals 46 and 47 generated by the first detecting device 38 represent a displacement or positional relation between the first grating 30 on the mask 28 and the first grating 33 on the wafer 29. The beat signals 46 and 47 generated by the second detecting device 39 represent a displacement or positional relation between the second grating 31 on the mask 28 and the second grating 34 on the wafer 29. The beat signals 46 and 47 generated by the third detecting device 40 represent a displacement or positional relation between the third grating 32 on the mask 28 and the third grating 35 on the wafer 29.

A phase meter 70 detects the difference in phase between the beat signals 46 and 47 generated by the first detecting device 38. The output signal from the phase meter 70 is fed to a controller 71 including a calculator and drive circuits.

A phase meter (not shown) detects the difference in phase between the beat signals 46 and 47 generated by the second detecting device 39. The output signal from this phase meter is also fed to the controller 71.

A phase meter (not shown) detects the difference in phase between the beat signals 46 and 47 generated by the third detecting device 40. The output signal from this phase meter is also fed to the controller 71.

The controller 71 generates drive signals 72a, 72b, and 72c in accordance with the output signals from the phase meters. The drive signals 72a, 72b, and 72c are fed to actuators 74c, 74b, and 74a respectively. The actuators 74a, 74b, and 74c are mechanically connected to a wafer stage 73 on which the wafer 29 is mounted. The actuators 74a, 74b, and 74c move the wafer stage 73 relative to the mask 28 in accordance with the drive signals 72a, 72b, and 72c so that an acceptable alignment between the mask 28 and the wafer 29 can be attained. The actuators 74a, 74b, and 74c are designed to produce a movement of the wafer stage 72 along an X direction, a movement of the wafer stage 72 along a Y direction, and a rotation of the wafer stage 72.

Figure 2:
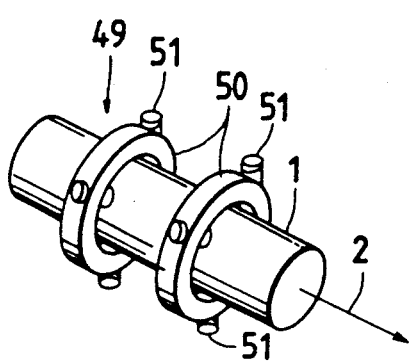
FIG. 2 is a perspective view of the Zeeman laser and an associated adjusting mechanism.

As shown in FIG. 2, a body of the Zeeman laser 1 is supported by an adjusting mechanism 49. The adjusting mechanism 49 includes a pair of rings 50 supported on a frame (not shown). Screws 51 are movably mounted on each of the rings 50 and are spaced at equal angular intervals of 120 degrees. Tips of the screws 51 engage the body of the Zeeman laser 1 so that the body of the Zeeman laser 1 is supported on the rings 50 via the screws 51. The optical axis of the Zeeman laser 1 can be changed along any directions by adjusting the screws 51 and moving the body of the Zeeman laser 1.

Figure 3:
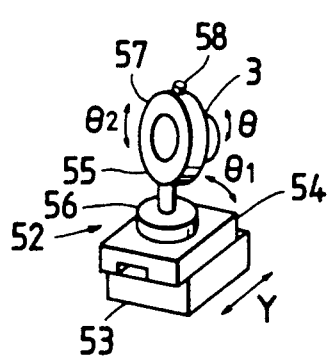
FIG. 3 is a perspective view of the mirror and an associated adjusting mechanism.

As shown in FIG. 3, the mirror 3 is supported by an adjusting mechanism 52. The adjusting mechanism 52 includes a base 53 and a movable member 54 supported on the base 53. The movable member 54 can slide relative to the base 53 in a direction Y. The position of the movable member 54 relative to the base 53 can be changed by operating a moving device (not shown) including a screw. A shaft 55 is rotatably mounted on the movable member 54 via a disc 56. A ring 57 is attached to the shaft 55. Screws 58 are movably mounted on the ring 57. The tips of the screws 58 engage the mirror 3 so that the mirror 3 is supported on the ring 57 via the screws 58. The mirror 3 can be moved in the direction Y by sliding the movable member 54 relative to the base 53. The mirror 3 can be rotated in a direction $\theta 1$ by rotating the shaft 55. The mirror 3 can be moved vertically in a direction $\theta 2$ by adjusting the screws 58. The mirror 3 can be rotated circumferentially in a direction $\theta$ by releasing the screws 58 and rotating the mirror 3.

The mirrors 8, 12, 13, 14, 15, and 16, and the beam splitters 5 and 9 are supported by respective adjusting mechanisms which are similar to the adjusting mechanism 52 for the mirror 3.

Figure 4:
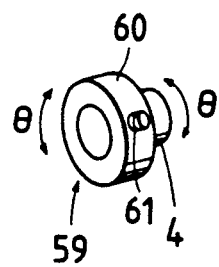
FIG. 4 is a perspective view of the quarter wave plate and an associated adjusting mechanism.

As shown in FIG. 4, the quarter wave plate 4 is supported by an adjusting mechanism 59. The adjusting mechanism 59 includes a ring 60 supported by a frame (not shown). Screws 61 are movably mounted on the ring 60. The tips of the screws 61 engage the quarter wave plate 4 so that the quarter wave plate 4 is supported on the ring 60 via the screws 61. The quarter wave plate 4 can be rotated circumferentially in a direction $\theta$ by releasing the screws 61 and rotating the quarter wave plate 4.

The reference gratings 17, 18, and 19, the half wave plates 24, and the polarizing filters 42 are supported by respective adjusting mechanisms which are similar to the adjusting mechanism 59 for the quarter wave plate 4.

Figure 5:
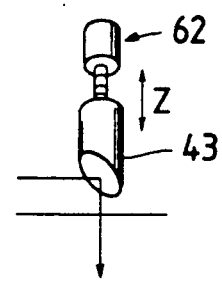
FIG. 5 is a perspective view of the knife-edged mirror and an associated adjusting mechanism.

As shown in FIG. 5, each of the knife-edged mirror 43 is supported by an adjusting mechanism 62. The adjusting mechanism 62 includes a threaded member movably supported by a frame (not shown). The knife-edged mirror 43 is mounted on the movable member so that the knife-edged mirror 43 can be moved in a direction Z which affects the separation of the lights coming from the polarizing filter 42.

Figure 6:
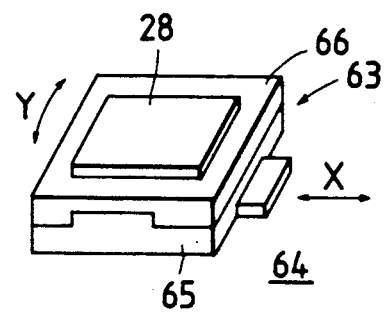
FIG. 6 is a perspective view of the mask and an associated adjusting mechanism.

As shown in FIG. 6, the mask 28 is supported by an adjusting mechanism 63. The adjusting mechanism 63 includes a base 64 and a first movable member 65 supported on the base 64. The first movable member 65 can slide relative to the base 64 in a direction X. The position of the first movable member 65 relative to the base 64 can be changed by operating a moving device (not shown) including a screw. A second movable member 66 is mounted on the first movable member 65. The second movable member 66 can slide relative to the first movable member 65 in a direction Y perpendicular to the direction X. The position of the second movable member 66 relative to the first movable member 65 can be changed by operating a moving device (not shown) including a screw. The mask 28 is mounted on the second movable member 66. Thus, the mask 28 can be moved in the directions X and Y which are perpendicular to each other.

The wafer 29 may be supported by an adjusting mechanism which is similar to the adjusting mechanism 63 for the mask 28. In this case, the wafer 29 can be moved in the directions X and Y perpendicular to each other.

In preparation for a process of aligning the mask 28 and the wafer 29, the alignment apparatus is adjusted as follows. Firstly, the Zeeman laser 1 is suitably located by operating the adjusting mechanism 49. The mirrors 3, 8, and 13 are suitably located by operating the associated adjusting mechanisms to realize a desired path of the laser light 2. Then, the beam splitters 5 and 9, and the mirrors 12, 14, 15, and 16 are suitably located by operating the associated adjusting mechanisms. Subsequently, the quarter wave plate 4 is suitably located to realize a desired direction of polarization by operating the adjusting mechanism 59. The reference gratings 17, 18, and 19, the half wave plates 24, and the polarizing filters 42 are suitably located with respect to the laser lights 7, 10, and 11 by operating the associated adjusting mechanisms. By operating the adjusting mechanisms 62, the knife-edged mirrors 43 are suitably located so that the lights from polarizing filter 42 can be separated. The other optical parts are suitably located by operating the associated adjusting mechanisms.

After the adjustment of the alignment apparatus is completed, the process of aligning the mask 28 and the wafer 29 is executed as follows. Firstly, the mask 28 and the wafer 29 are placed on the respective adjusting mechanisms, and a rough alignment between the mask 28 and the wafer 29 is performed by use of an optical device (not shown). After the rough alignment between the mask 28 and the wafer 29 is completed, the Zeeman laser 1 is activated to generate the laser light 2. As understood from the previous description, when the laser light 2 is generated, the detecting devices 38, 39, and 40 output the beat signals 46 and 47. The relative positions of the mask 28 and the wafer 29 are two-dimensionally adjusted in accordance with the beat signals 46 and 47 by the control system including the devices 70, 71, 74a, 74b, 74c, and 73. Specifically, the relative positions of the mask 28 and the wafer 29 are adjusted so as to equalize the phases of the beat signals 46 and 47 generated by each of the detecting devices 38, 39, and 40. When the phases of the beat signals 46 and 47 generated by each of the detecting devices 38, 39, and 40 are equalized, the mask 28 and the wafer 29 are aligned acceptably.

According to experiments, it was found that the mask 28 and the wafer 29 could be aligned within an accuracy having a nanometer order.

What is claimed is:

1. An apparatus for aligning a mask and a wafer comprising:
   a light source emitting light having two components which have slightly-different frequencies and which have different planes of polarization;
   means for separating the light emitted from the light source into first, second, and third light parts travelling along different paths respectively;
   first, second, and third reference gratings diffracting the first, second, and third light parts respectively;
   first, second, and third illumination optical systems selectively transmitting the diffracted first, second, and third light parts coming from the first, second, and third gratings respectively;

first, second, and third mark gratings formed on the mask and illuminated with the first, second, and third light parts coming from the first, second, and third illumination systems respectively, wherein the first, second, and third mark gratings on the mask diffract the first, second, and third light parts coming from the first, second, and third illumination systems respectively, wherein the first and second mark gratings on the mask are directed in parallel, and wherein the third mark grating on the mask is directed perpendicular to the first and second mark gratings on the mask;

first, second, and third mark gratings formed on the wafer in correspondence with the first, second, and third mark gratings on the mask and illuminated with the first, second, and third light parts coming from the first, second, and third illumination systems respectively, wherein the first, second, and third mark gratings on the wafer diffract the first, second, and third light parts coming from the first, second, and third illumination systems respectively, wherein the first and second mark gratings on the wafer are directed in parallel, and wherein the third mark grating on the wafer is directed perpendicular to the first and second mark gratings on the wafer;

a first detecting device detecting first optical beat signals of the diffracted lights coming from the first mark grating on the mask and the first mark grating on the wafer, the first optical beat signals representing a positional error between the mask and the wafer;

means for comparing phases of the first detected beat signals and generating a first control signal dependent on a difference between the phases of the first beat signals;

a second detecting device detecting second optical beat signals of the diffracted lights coming from the second mark grating on the mask and the second mark grating on the wafer, the second optical beat signals representing a positional error between the mask and the wafer;

means for comparing phases of the second detected beat signals and generating a second control signal dependent on a difference between the phases of the second beat signals;

a third detecting device detecting third optical beat signals of the diffracted lights coming from the third mark grating on the mask and the third mark grating on the wafer, the third optical beat signals representing a positional error between the mask and the wafer;

means for comparing phases of the third detected beat signals and generating a third control signal dependent on a difference between the phases of the third beat signals; and means for adjusting relative positions of the mask and the wafer in accordance with the first, second, and third control signals.

2. The apparatus of claim 1 wherein the light source comprises a Zeeman laser, and further comprising a quarter wave plate compensating a phase of the light emitted from the Zeeman laser.

3. The apparatus of claim 2 wherein the separating means comprises first and second beam splitters, and a plurality of mirrors.

4. The apparatus of claim 1 wherein the separating means comprises first and second beam splitters, and a plurality of mirrors.

5. The apparatus of claim 1 wherein each of the first, second, and third illumination optical systems comprises a spatial filter removing 0-order, 2-order, and higher-order diffracted lights and selecting ±1-order diffracted lights, and a phase compensating plate changing a phase of one of the ±1-order diffracted lights by 180 degrees, and is telecentric at a mask side.

6. The apparatus of claim 1 wherein each of the first, second, and third detecting devices comprises a focusing lens focusing the diffracted lights, a polarizing element selecting predetermined-polarization components of the focused lights coming from the focusing lens, a knife-edged mirror separating the selected light components into two groups each having the lights coming from the mark grating on the mask and the mark grating on the wafer, a first photodetector detecting the lights in one of the groups, and a second photodetector detecting the lights in the other of the groups.

7. The apparatus of claim 1 wherein the light source comprises a Zeeman laser, and further comprising a quarter wave plate compensating a phase of the light emitted from the Zeeman laser; wherein the separating means comprises first and second beam splitters, and a plurality of mirrors; wherein each of the first, second, and third illumination optical systems comprises a spatial filter removing 0-order, 2-order, and higher-order diffracted lights and selecting ±1-order diffracted lights, and a phase compensating plate changing a phase of one of the ±1-order diffracted lights by 180 degrees, and is telecentric at a mask side; and wherein each of the first, second, and third detecting devices comprises a focusing lens focusing the diffracted lights, a polarizing element selecting predetermined-polarization components of the focused lights coming from the focusing lens, a knife-edged mirror separating the selected light components into two groups each having the lights coming from the mark grating on the mask and the mark grating on the wafer, a first photodetector detecting the lights in one of the groups, and a second photodetector detecting the lights in the other of the groups.

8. The apparatus of claim 7 further comprising means for adjusting a position of the Zeeman laser, means for adjusting positions of the beam splitter and the mirrors, means for adjusting positions of the quarter wave plate, the reference gratings, the phase compensating plate, and polarizing elements, and means for adjusting positions of the knife-edged mirrors.

9. An apparatus for aligning a mask and a wafer comprising:
a light source emitting light having two components which have slightly-different frequencies and which have different planes of polarization;
means for separating the light emitted from the light source into first, second, and third light parts travelling along different paths respectively;
first, second, and third reference gratings diffracting the first, second, and third light parts respectively;
first, second, and third illumination optical systems selectively transmitting the diffracted first, second, and third light parts coming from the first, second, and third gratings respectively;
first, second, and third mark gratings formed on the mask and illuminated with the first, second, and third light parts coming from the first, second, and third illumination systems respectively, wherein the first, second, and third mark gratings on the mask diffract the first, second, and third light parts coming from the first, second, and third illumination systems respectively, wherein the first and second mark gratings on the mask are directed in parallel, and wherein the third mark grating on the mask is directed perpendicular to the first and second mark gratings on the mask;

first, second, and third mark gratings formed on the wafer in correspondence with the first, second, and third mark gratings on the mask and illuminated with the first, second, and third light parts coming from the first, second, and third illumination systems respectively, wherein the first, second, and third mark gratings on the wafer diffract the first, second, and third light parts coming from the first, second, and third illumination systems respectively, wherein the first and second mark gratings on the wafer are directed in parallel, and wherein the third mark grating on the wafer is directed perpendicular to the first and second mark gratings on the wafer;

a first detecting device detecting first optical beat signals of the diffracted lights coming from the first mark grating on the mask and the first mark grating on the wafer, the first optical beat signals representing a positional error between the mask and the wafer;

a second detecting device detecting second optical beat signals of the diffracted lights coming from the second mark grating on the mask and the second mark grating on the wafer, the second optical beat signals representing a positional error between the mask and the wafer;

a third detecting device detecting third optical beat signals of the diffracted lights coming from the third mark grating on the mask and the third mark grating on the wafer, the third optical beat signals representing a positional error between the mask and the wafer; and means for adjusting relative positions of the mask and the wafer.

10. An apparatus for aligning a mask and a wafer comprising:

a light source emitting light having two components which have slightly-different frequencies and which have different planes of polarization;

means for separating the light emitted from the light source into first, second, and third light parts travelling along different paths respectively;

first, second, and third reference gratings diffracting the first, second, and third light parts and thereby generating first, second, and third diffracted lights respectively;

first, second, and third mark gratings formed on the mask, wherein lines of the first mark grating on the mask are parallel to lines of the second mark grating on the mask, and lines of the third mark grating on the mask are perpendicular to the lines of the first and second mark gratings on the mask;

first, second, and third mark gratings formed on the wafer in correspondence with the first, second, and third mark gratings on the mask, wherein lines of the first mark grating on the wafer are parallel to lines of the second mark grating on the water, and lines of the third mark grating on the wafer are perpendicular to the lines of the first and second mark gratings on the wafer;

means for selecting predetermined-order components of the first diffracted light and thereby generating first predetermined-order lights;

means for applying the first predetermined-order lights to the first mark grating on the mask and the first mark grating on the wafer;

means for detecting beats between the first predetermined-order lights diffracted by the first mark grating on the mask and the first predetermined-order lights diffracted by the first mark grating on the wafer;

means for selecting predetermined-order components of the second diffracted light and thereby generating second predetermined-order lights;

means for applying the second predetermined-order lights to the second mark grating on the mask and the second mark grating on the wafer;

means for detecting beats between the second predetermined-order lights diffracted by the second mark grating on the mask and the second predetermined-order lights diffracted by the second mark grating on the wafer;

means for selecting predetermined-order components of the third diffracted light and thereby generating third predetermined-order lights;

means for applying the third predetermined-order lights to the third mark grating on the mask and the third mark grating on the wafer; and means for detecting beats between the third predetermined-order lights diffracted by the third mark grating on the mask and the third predetermined-order lights diffracted by the third mark grating on the wafer.

* * * * *